(12) United States Patent
Clidaras et al.

(10) Patent No.: US 7,564,685 B2
(45) Date of Patent: Jul. 21, 2009

(54) MOTHERBOARDS WITH INTEGRATED COOLING

(75) Inventors: Jimmy Clidaras, Los Altos, CA (US); Winnie Leung, Mountain View, CA (US)

(73) Assignee: Google Inc., Mountain View, CA (US)

( * ) Notice: Subject to any disclaimer, the term of this patent is extended or adjusted under 35 U.S.C. 154(b) by 28 days.

(21) Appl. No.: 11/618,611

(22) Filed: Dec. 29, 2006

(65) Prior Publication Data

US 2008/0158818 A1 Jul. 3, 2008

(51) Int. Cl.
*H02K 7/20* (2006.01)
*F28F 7/00* (2006.01)

(52) U.S. Cl. ............... 361/699; 62/259.2; 165/80.4; 361/698; 361/721

(58) Field of Classification Search ........... 361/695, 361/699, 702
See application file for complete search history.

(56) References Cited

U.S. PATENT DOCUMENTS

| | | | | |
|---|---|---|---|---|
| 4,777,561 A | * | 10/1988 | Murphy et al. | 361/700 |
| 4,884,168 A | * | 11/1989 | August et al. | 361/702 |
| 5,768,104 A | * | 6/1998 | Salmonson et al. | 361/704 |
| 5,907,475 A | * | 5/1999 | Babinski et al. | 361/719 |
| 6,151,215 A | * | 11/2000 | Hoffman | 361/704 |
| 6,910,637 B2 | * | 6/2005 | Hsieh et al. | 235/492 |
| 7,130,191 B2 | * | 10/2006 | Lin et al. | 361/695 |
| 7,309,911 B2 | * | 12/2007 | Bartley et al. | 257/675 |
| 2002/0053726 A1 | * | 5/2002 | Mikubo et al. | 257/685 |
| 2003/0128508 A1 | * | 7/2003 | Faneuf et al. | 361/687 |
| 2004/0225816 A1 | * | 11/2004 | Leigh et al. | 710/305 |

* cited by examiner

*Primary Examiner*—Gregory D Thompson
(74) *Attorney, Agent, or Firm*—Fish & Richardson P.C.

(57) ABSTRACT

A computer apparatus includes a first motherboard having a top surface and a bottom surface and a second motherboard having a top surface and a bottom surface. The motherboards each have mounted thereto components that generate high thermal loads and components that generate low thermal loads. A heat sink is in conductive thermal contact with the top surfaces of the first and second motherboards. Computer components generating high thermal loads are mounted to the top surfaces of the first and second motherboards, and computer components generating low thermal loads are mounted to the bottom surface of one or more of the first and second motherboards.

20 Claims, 6 Drawing Sheets

MOTHERBOARDS WITH INTEGRATED COOLING

TECHNICAL FIELD

This document generally describes cooling mechanisms for electronic components, such as computer motherboards and related components in computer data center racks.

BACKGROUND

Computer users often focus on the speed of computer microprocessors (e.g., megahertz and gigahertz). Many forget that this speed often comes with a cost—higher electrical consumption. For one or two home PCs, the extra power may be negligible when compared to the cost of running many other electrical appliances in a home. But in data center applications, where thousands of microprocessors may be operated, electrical power requirements can be very important.

Power consumption brings a second expense also—the cost of removing heat generated by the consumed electricity. That is because, by simple laws of physics, all the power has to go somewhere, and that somewhere is, for the most part, conversion into heat. A pair of microprocessors mounted on a single motherboard can draw 200-400 watts or more of power that is turned into heat. Multiply that figure by several thousand (or tens of thousands) to account for the many computers in a large data center, and one can readily appreciate the amount of heat that can be generated. It is much like having a room filled with thousands of burning floodlights.

Moreover, there are many benefits to placing computing components in as compact a space as possible. Such arrangements can permit for faster processing speeds. Also, fewer components may be needed, such as when multiple processors are mounted on a single motherboard. In addition, such systems can be more reliable because they involve fewer connections and components, and can be produce in a more automated fashion. However, when systems are more compact, the same amount of heat may be generated in a much smaller space, and all of the heat may need to be removed from the small space.

Heat removal can be important because, although microprocessors may not be as sensitive to heat as are people, increases in heat generally can cause great increases in microprocessor errors. In sum, such a system may require electricity to heat the chips, and more electricity to cool the chips.

SUMMARY

This document describes techniques for cooling computing components, and particularly those used in multi-motherboard arrangements such as vertically stacked racks of computers in a data center. In general, motherboards are mounted in a paired fashion on opposed sides of a heat sink. A relatively cool fluid, such as chilled water, may be circulated through the heat sink to provide high-level cooling, and components that generate high levels of heat, such as microprocessors, may be in contact with the heat sink, so as to receive increased cooling. Components that generate relatively little heat, such as memory chips and fixed disk drives, may be mounted on the opposed sides (the outer surfaces of the sandwich) of the motherboards. The motherboard-sink-motherboard assembly may then be placed as one of many assemblies in a series of data center racks.

In one implementation, a computer apparatus is disclosed. The apparatus includes a first motherboard having a top surface and a bottom surface, a second motherboard having a top surface and a bottom surface, and a heat sink in conductive thermal contact with the top surfaces of the first and second motherboards. The computer components generating high thermal loads are mounted to the top surfaces of the motherboards, and computer components generating low thermal loads are mounted to the bottom surface of one or more of the motherboards. The heat sink may also comprise a solid heat-conductive block housing fluid flow paths for carrying cooling fluid. The components generating low thermal loads mounted to the bottom surface of one or more of the motherboards may comprise in-line memory modules.

In some aspects, each motherboard carries a plurality of common components, and the common components are arranged linearly to align with portions of equal depth on the heat sink. Certain implementations may further comprise a fan mounted to one of the motherboards and arranged to circulate air across the components generating low thermal loads. In addition, a fluid standpipe fluidly connected to the heat sink and arranged to provide cooling fluid to the heat sink may be provided. A refrigeration cycle apparatus in fluid communication with the heat sink to provide cooled fluid to the heat sink and receive warmed fluid form the heat sink may additionally be provided.

In certain aspects, the apparatus may further comprise a plurality of computer apparatuses mounted in data center racks and including one or more heat sinks. The plurality of mechanisms may include data jacks near a front edge of the mechanisms and cooling fluid connections near a rear edge of the mechanisms.

In another implementation, a method of organizing computer components is disclosed. The method comprises providing a plurality of computer assemblies having a heat sink between a pair of motherboards, wherein high heat generating components contact the heat sink and low heat generating components are attached to sides of the motherboards away from the heat sink; mounting the motherboards in a server rack; and passing air over the low heat generating components, and passing cooling fluid through the heat sink. The method may further comprise passing cooling fluid through the heat sink. In addition, the method may comprise controlling the rate of flow of the air to maintain set operation parameters for the computer components. The rate of air flow may be controlled individually for each of the plurality of computer assemblies.

In yet another implementation, a computer cooling system is disclosed. The system comprises a heat sink mounted between a pair of motherboards in thermal contact with high heat-generating components on a first side of each motherboard, low heat generating components on the second sides of each motherboard, and one or more fans arranged to move air across the second sides of the motherboards.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
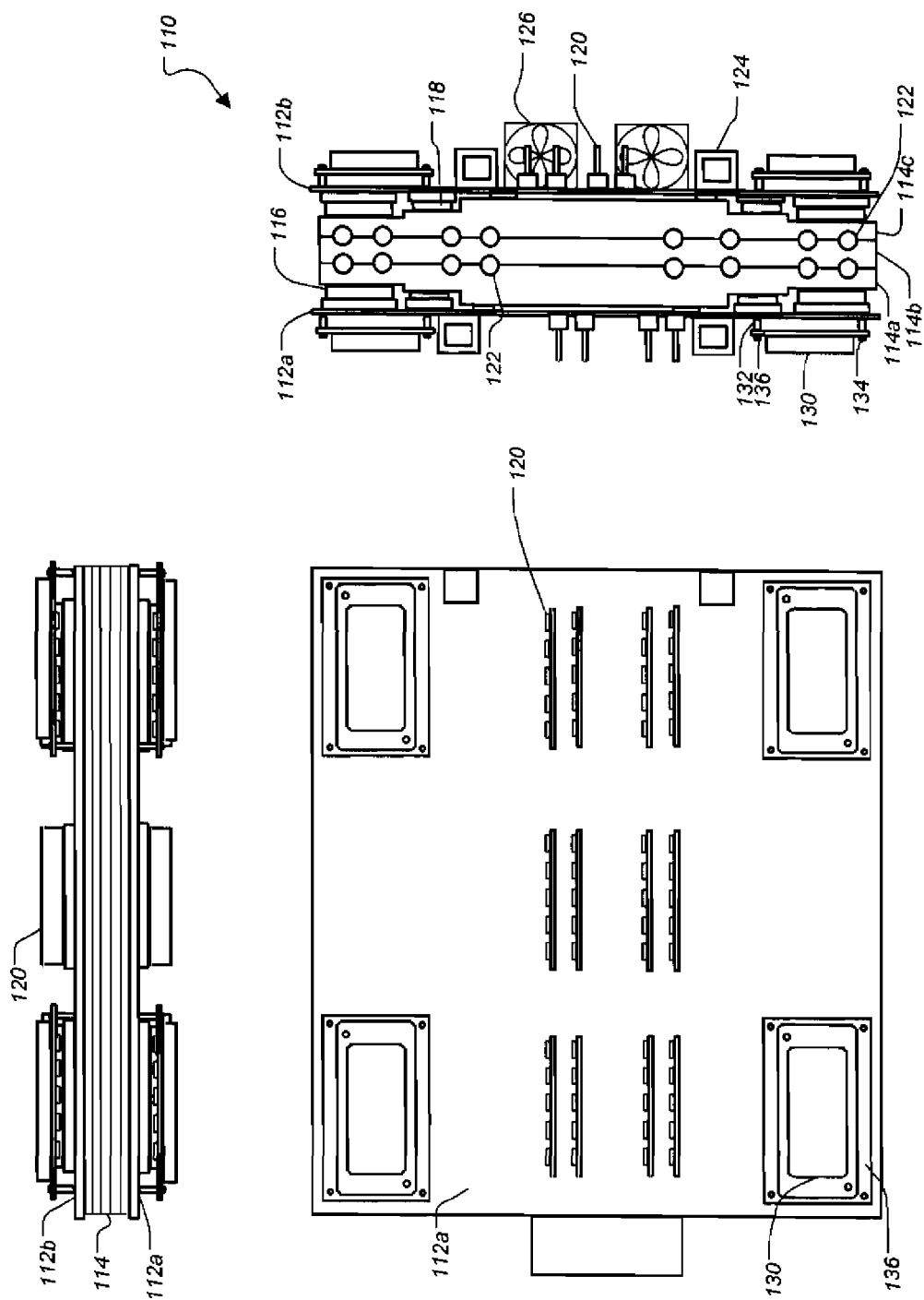
FIG. 1 shows front, top, and side views of a computer assembly.

FIG. 1 shows front, top, and side views of a computer assembly 110. The computer assembly 110 may include a variety of components needed to operate a more general computer system or a portion of a computer system. A computer system may include a wide range of computing components, and is not limited to traditional PC's, mainframes, or other such computers. In addition, a device may be considered a computer even if it does not have a full complement of input/output components such as a monitor, keyboard, or other such items.

Components that generate a relatively large amount of heat (i.e., high heat-generating components), such as microprocessors, may be placed on one side of each motherboard assembly 112a, 112b of a paired set of motherboard assemblies, and may be provided with intensive cooling via conductive heat transfer, while components that generate a relatively small amount of heat (i.e., low heat-generating components) such as memory chips and fixed storage, may be placed on an opposed side of the motherboard assemblies 112a, 112b from the high heat-generating components, and may be provided with more moderate levels of cooling using circulating air, including relatively warm (e.g., above 70 degrees Fahrenheit) circulating air. The computer assembly 110 may be mounted horizontally or vertically, and may be stacked in a small space, such as in a server rack in a data center. The combined assemblies may together generate a very large amount of heat, and the mechanisms discussed here can assist in removing that heat efficiently and effectively.

As shown in the exemplary apparatus in the FIG. 1, to dissipate and remove heat from the operating components, the motherboard assemblies 112a and 122b are mounted top-to-top (where the side holding the high heat-generating components is considered the top) to heat sink 114. Each assembly 112a, 112b may hold various components needed in a machine such as a computer server or other similar device, including a number of processors and other micro-circuits.

The heat sink 114 may be used to draw heat out of the components on the tops of motherboard assemblies 112a and 112b, and to thereby maintain or decrease a particular temperature around the components located on the motherboard assemblies 112a and 112b. For example, the heat sink 114 may be manufactured as an aluminum block with passages to carry cooling fluid (such as in the form of water or another liquid) to pass through and cool components in thermal contact with the heat sink 114. The heat sink 114 may have areas of differing depth on its surfaces that contact the motherboard assemblies 112a, 112b, so as to be able to contact all components even if they extend from the upper surfaces of motherboard assemblies 112a, 112b to differing heights. The particular pattern of lands and valleys formed on the heat sink may be selected to match with a corresponding pattern of components on a motherboard assembly 112a, 112b. Such arrangement may include linear positioning of items having equal heights so as to simplify the manufacturing of heat sink 114.

Fans and other cooling mechanisms may also be used to cool components on motherboard assemblies 112a and 112b. Fans 126, for example, may be placed near the motherboard assemblies 112a and 112b, such as on the back edge of one of motherboard assemblies 112a, 112b, so as to pull cooling air across components mounted to the back of the assemblies. As discussed in more detail below, where sets of computer systems 110 are mounted in a rack, a fan mounted to one motherboard assembly may draw air across the backs of adjacent computer assemblies 110.

The motherboard assembly 112a may include a motherboard in the form of a controlling circuit board in a computing device that can electrically connect attached components (e.g., memory, processors, and peripheral devices) to each other directly, or over one or more communication buses. As shown in computer assembly 110, the motherboard assemblies 112a, 112b each include multiples of a microprocessor 116, a chipset 118, memory 120, a network connector 124, and a fixed disk drive 130. In various implementations, the motherboard assemblies 112a, 112b can contain single or multiples of each of the relevant components. For example, the motherboard assemblies 112a, 112b in system 110 may include other processing devices (e.g., CPUs, MMUs, ASICs, FPGAs, and DSPs), memory (e.g., single in-line memory modules (SIMM) and dual in-line memory modules (DIMM), flash memory, etc.), mass storage interfaces (e.g., USB), serial and parallel ports, expansion slots, and controllers required to control standard peripheral devices, such as a display screen, keyboard, and disk drive. Alternatively, certain such components may be omitted where they are not necessary to the operation of computer assembly 110, or may be included on other boards or other portions of a larger system, such as in a datacenter. For example, certain sub-systems may be dedicated to processing, while others may be dedicated to mass storage.

The motherboard assemblies 112a, 112b shown here are two-sided assemblies that include devices on each side. As such, components and traces on a top side of the motherboard assembly 112a can be connected to components on a bottom side of the motherboard assembly 112a through electrical traces and vias in the relevant circuit board. For example, a particular microprocessor 116 (and chip set) on the top side of one motherboard may be electrically connected to a memory 120 or fixed disk 130 on the bottom side of the motherboard through a shared trace.

In some implementations, component placement may be determined by the amount of heat generated by a particular component. Therefore, components having similar thermal heat emissions may be grouped together on a motherboard. For example, the top side of the motherboard assembly 112a may include components that produce a high thermal load, such as the microprocessor 116, while the bottom side of the motherboard assembly 112a may include components that produce a low thermal load, such as the in-line memory 120 or fixed disk 130. In other implementations, one side of the motherboard may be free of components. For example, all components may be placed on one side of the motherboard 112a or 112b, regardless of a component's produced thermal load. Different forms of cooling may then be used on a single side of the board in different areas, such as by providing a heat sink in one area, and convection cooling from circulation fans in another area. In addition, certain components may be included on other boards, such as by placing fixed disk drives in a module separate form most other computing components.

As explained in more detail below, components may also be arranged within a single side of a motherboard assembly 112a, 112b according to their expected thermal load, such as by placing the highest heat-generating components nearest to passages for cooling fluid in the heat sink 114, or by placing such components where cooling fluid enters the heat sink, because the fluid will be its coolest at such a point, and thus may draw off the most heat there (because heat transfer between two bodies is directly related to the temperature difference between them). Such arrangements may also permit for easier machining of heat sink 114, such as by located components having similar heights on common axes of the heat sink 114.

Motherboard assemblies 112a, 112b may also support one or more chipsets 118 for implementing various functionality on computer assembly 110. A chipset 118 may be made up of a group of integrated circuits designed to function together. For example, one chipset may create graphics for a display device, while another can provide for communication between a processor and memory or a storage device. Such connections have been referenced as Northbridge and Southbridge connections, with one chip and package (Northbridge) for relatively high-speed operations like video and memory access, and another (Southbridge) for lower speed communications (I/O control).

Other forms of chipset 118, including custom chipsets that may integrate certain functions (e.g., those needed only for a server in a data center) onto a single chip, may also be employed. For example, graphics circuitry may be minimized or wholly eliminated. Also, networking functionality may be provided, similar to a LAN on Motherboard (LOM) implementation, on the chipset itself. Other various I/O support circuitry may also be eliminated, particularly where the computer assembly is to be accessed only over a network. By lessening the amount of circuitry needed for non-server tasks, the chipset may fit in less space, may more readily be implemented on a single chip, and may be operated at higher clock rates. In addition, the circuitry may be more tightly integrated with the processor, and in some circumstances integrated with the processor itself, to further simplify the arrangement of computer assembly 110. Other functions may also be added to the chipset that would normally be handled by a separate controller.

Persistent storage in the form of a number of fixed disks 130 may also be provided with the computer assembly 110, or may be provided on trays separate from computer assembly 110. As shown, the fixed disks 130 are mounted on stand-offs 132 extending from a back side of motherboard assemblies 112a, 112b that serve to hold the fixed disks 130 away from the assemblies 112a, 112b. In being spaced from the motherboards, the fixed disks may be prevented from shorting out soldered connections or traces on the motherboards. In addition, the stand-offs 132 may permit air to circulate below the fixed disks 130, so as to provide, for example, cooling for heat that conducts from processors on the opposed side of a motherboard and through the motherboard.

Each fixed disk 130 may be mounted to a base plate 136 having flanges that extend beyond the edges of the fixed disk 130. Holes may be provided in the flanges so as to align with the stand offs 132 on the motherboard assemblies 112a, 112b. Fasteners such as quarter-turn locking screws or similar fasteners may then be provided to attach the fixed disks 130 to the motherboard assemblies 112a, 112b.

The predominant portion of the heat generated by components mounted to motherboard assemblies 112a, 112b may be carried away by cooling fluid flowing through the heat sink 114. Such heat transfer may occur via conduction through physical contact between the heat sink 114 and the components. Also, various conductivity enhancers, such as thermal greases (including those containing colloidal silver), may be used in manners known to one of skill in the art. In addition, clamping mechanisms, screws/bolts, or other thermal adhesives may be used to hold the heat sink 114 tightly between the motherboard assemblies 112a, 112b. Having close thermal contact may allow the heat sink 114 to absorb and/or dissipate heat from the components included on the motherboards effectively.

Fluid passages 122 may be accessible from one or more portions of heat sink 114 to allow for water or other cooling fluids to traverse the heat sink 114 and remove heat from the heat sink 114. (Although the fluid passages 122 would normally be accessible from the read of the assembly 110 rather than the front, they are shown here for clarity.) As a result, the heat sink will be kept cool, and will draw heat by conduction from the heat-generating components. In operation, a fluid such as water may be circulated through passages 112 and may have its temperature controlled, such as by providing the water at an entering temperature of between 32 (or lower) and 70 degrees Fahrenheit. Liquid supply and return tubes (see FIG. 5B) may be connected to the passages to supply cooling fluid from a central system, and to carry heated fluid away. Circulation of fluid to the components may be by pressure created centrally in the system (e.g., from natural tap water pressure) or by pumps, such as those located centrally to a data center or at each rack or even at each computer assembly 110. As one example, small peristaltic pumps can be provided with each computer assembly 110 to create liquid circulation for each motherboard in the computer assembly 110. Such pumping may permit for close assembly-by-assembly control. Central pumps may also be employed, and may permit for centralized control of fluid pressure and easier-to-maintain systems.

The exemplary heat sink 114 includes three layers of material welded, adhered, clamped, or otherwise joined together. The first layer 114a has been milled to fit the landscape of the motherboard assembly 112a. For example, when a component on the motherboard 112a extends out, the heat sink 114 has been milled inward to make room for the component. As shown, the first layer 114a contacts a second layer 114b, which in turn contacts a third layer 114c. The third layer 114c may, like the first layer 114a, be milled or otherwise formed to match the profile of components on motherboard assembly 112b. Each layer 114a, 114b, 114c may have portions of fluid paths milled in them. For example, as shown, each layer 114a, 114b, 114c has a half-circle path milled in its surface that matches a corresponding path in the adjacent layer. Additional structures may be provided around the paths to prevent leakage, such as fine extensions and corresponding grooves on each side of the path. In addition, the paths may be formed symmetrically so that the outside layers 114a, 114c may be used interchangeably (e.g., flip-flopped). In another implementation, the middle layer 114b may be removed, and other arrangements may be used.

The layers 114a, 114b, 114c may be connected and mounted in various manner. For example, though-holes may be provided through layers 114a, 114c, and screws or other attachment mechanisms may be passed through the holes, into layer 114b, and tightened. The motherboard assemblies 112a, 112b may be attached to the heat sink 114 by similar mechanisms. Alternatively, layers 114a, 114b, 114c may be clamped or clipped together to form a solid central portion of computer assembly 110, and motherboard assemblies 112a, 112b may be attached in similar manners, such as by screw attachment or clamping on opposed sides.

Other heat relief mechanisms may also, or alternatively, be provided for components in computer assembly 110. For example, fans 126 may be used to air-cool components by creating an increased flow of air over the components, and to thereby dissipate heated air that forms around the motherboard assemblies 112a, 112b. Such fans 126 may also be supplemented by fans associated with particular components, such as impingement fans aimed at heat-generating components to provide additional air circulation around such components and to break down boundary layers that may otherwise create additional heat buildup on the components. An impingement fan, for example, may be mounted above a component to blow air downward toward, or upward away from, the component.

Various connections may also be provided to computer assembly 110. For example, the motherboards assemblies 112a, 112b may be provided with a network connection through one or more network connectors 124. The network connectors 124 may be in the form of an RF-45 jack, an Infiniband or Fibre Channel connection, or another electrical or optical networking connection. Other connections may also be provided, such as other optical networking connections, video output connections, and input connections such as keyboard or pointing device connections (not shown). In addition, electrical power connections may also be provided to the computer assembly 110, such as from a power supply mounted on each computer assembly 110 or at each rack in a datacenter. As one example, a power supply may be mounted near the back edge of the computer assembly 110 at the output side of fan 126, so that air is first drawn over the computer assembly 110, and only then passed through the power supply The connections to the computer assembly 110 may generally take the form of quick-connect safety mechanisms that are generally well-known in the art. For example, fluid connections may include snap-on connections with automatic seals, such as ball-valve seals that are well-known in the art. Electrical and networking connections may take the form of friction or snap-fit plugs or other similar connections, such as low-voltage electrical plugs and RJ-45 jacks. The connections may be provided with flexible fittings and extra "slack" to permit easy insertion and removal of a computer assembly 110 from a rack. For example, fluid connections may come from the rear of the rack and may be attached to flexible hoses that may extend forward out of the rack sufficiently to permit easy connection to the heat sink 114 before the computer assembly 110 is slid all the way into the rack. Other connections may be provided as part of a "docking" mechanism, whereby the connection is made when the computer assembly 110 is moved into position in a rack.

Other components of the computer assembly 110, such as other storage devices, communication ports, controllers and other chips, have been omitted for clarity in the figure, and may be selected and arranged in any appropriate manner. In addition, routing of traces on, and vias through, the motherboard assemblies 112a, 112b has not been shown, but would be known in the art. Appropriate techniques may be used in planning and forming such structures.

In operation, computer assembly 110 may be mounted flat horizontally in a server rack such as by sliding the computer assembly 110 into the rack from the rack front, and over a pair of rails in the rack on opposed sides of the computer assembly 110—much like sliding a lunch tray into a cafeteria rack. Computer assembly 110 may alternatively be mounted vertically, such as in a bank of trays mounted at one level in a rack. The front of the rack may be kept open to permit easy access to, and replacement of, assemblies, and to permit air to flow readily over the computer assembly 110 from a workspace where technicians or other professionals operating a data center may be located. In this context, the term workspace is intended to refer to areas in which technicians or others may normally be located to work on computers in a data center. A workspace is generally provided to allow access to equipment for installation, repair, or removal.

After sliding a computer assembly 110 into a rack, a technician may connect the computer assembly to appropriate services, such as a power supply connection, battery back-up, and a network connection. The computer assembly 110 may then be activated, or booted up, and may be communicated with by other components in the system. In addition, the computer assembly 110 can be mounted in the server rack such that it may be easily removed and taken for disassembly and repair or replacement.

The pictured implementation of the computer assembly 110 and similar implementations may be manufactured and assembled in volume at a central location and then shipped to a data center worksite for installation. The motherboard assemblies 112a, 112b may be manufactured and assembled according to an engineered design process. Care may be taken to create a component layout according to size, chipset, thermal production, and/or ESD (electrostatic discharge) sensitivity. Other considerations may likewise be used for layout determination.

Advantageously, the described system may provide for one or more benefits, such as matching heat transfer mechanisms to the level of heat dissipation required in a particular circumstance. Specifically, warm components such as processors can be cooled quickly and intensively through conductive transfer to the relatively cool heat sink 114. Such heavy heat transfer, which is often expensive because of the likely need to provide powered cooling for the cooling water, can be localized, however, so as to maximize its efficiency and to reduce the need to cool large spaces or to cool ambient air. More general cooling is provided by the circulating air, which need not be cooled as far as the cooling water, but can be provided in very large volumes. For example, air can be supplied to racks at 70 degrees Fahrenheit or higher, and can be cooled using water in a free-cooling arrangement that employs cooling towers but does not use chillers in typical operation.

Figure 2:
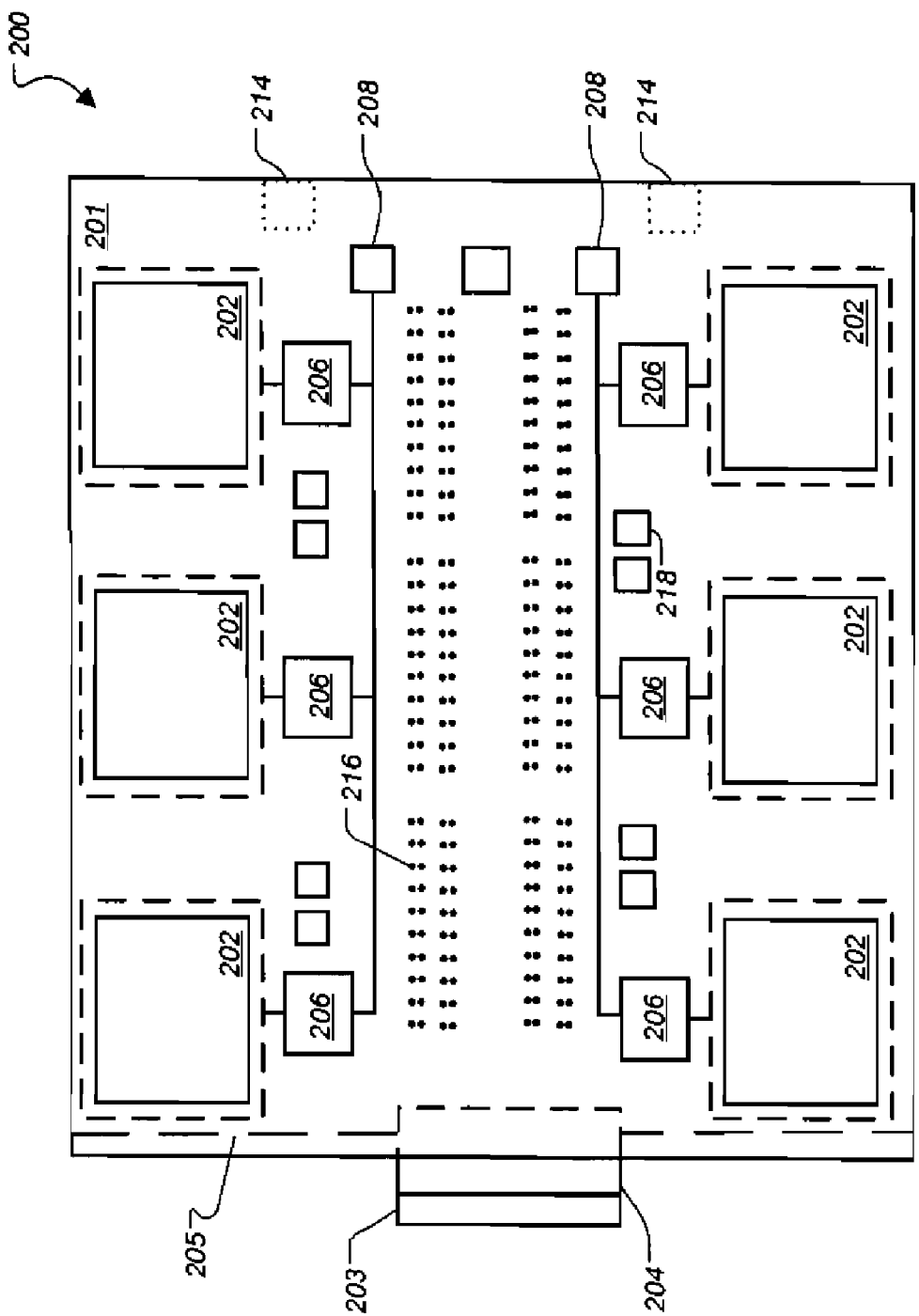
FIG. 2 shows a top view of a motherboard for use in a computer.

FIG. 2 shows a top view of a motherboard 200 for use in a computer assembly. In general, the motherboard 200 may include a standard circuit board 201 on which a variety of components are mounted. As shown, several microprocessors 202 can be arranged on the circuit board 201. Microprocessors 202 may be mounted in sockets, directly soldered to the motherboard 201, or otherwise electrically attached as necessary for operation.

The circuit board 201 may be arranged so that air enters at its side edge (right hand side), and flows over a number of heat generating components on the circuit board 201 (on its back or bottom side, as viewed in the figure), and may then be routed through a power supply 204 before being exhausted from the board 201. Each individual circuit board 201 may include its own power supply 204 for operating the system 200, and one power supply may also be shared by multiple circuit boards 201, such as by a paired set of circuit board 201. In some implementations, a fan 203 or fans may be added to push or pull the air flow through the power supply 204, thus increasing the cooling power of the air. In some implementations, walls 205 or baffles may be provided on either side of the fan 203 to direct air into the fan 203 as the air is drawn across the circuit board 201.

A number of points are shown in the figure near the left-to-right centerline of motherboard 201 and represent solder connections for in-line memory modules positioned on the opposed, back side of the circuit board 201. Various other connections and vias, though not shown, may also be provided to carry electrical signals across and through the circuit board 201.

The circuit board 201 may also include multiple chip sets 206, each represented here as a single chip, with each microprocessor 202 associated with a chip set 206. The chip sets 206 may in turn be connected to communicate with other components, such as electrical devices and chips on motherboard 201, as is necessary to power, control, and communicate with the microprocessors 202. The chip sets 206 for each microprocessor 202 may in turn be connected to network controller 208. As shown, each network controller 208 may control communications with several networked microprocessors 202. Other appropriate arrangements for the components on motherboard 201 are also contemplated. Also, traces (generally not shown) for connecting components may be provided as appropriate. Other connections may also be provided, such as other optical networking connections, video output connections, and input connections such as keyboard or pointing device connections (not shown). The network connectors 214 may be placed on the back side of the motherboard 201 along with memory 216 (not shown), so that neither component interferes with operation of a connected heat sink (not shown).

Motherboards may also include several other chips 218 for performing tasks on the device. In general, motherboards may incorporate both off-the-shelf chips and custom-designed chips, such as CPUs, microcontrollers, microprocessors, and digital signal processors (DSPs), to perform tasks.

Figure 3:
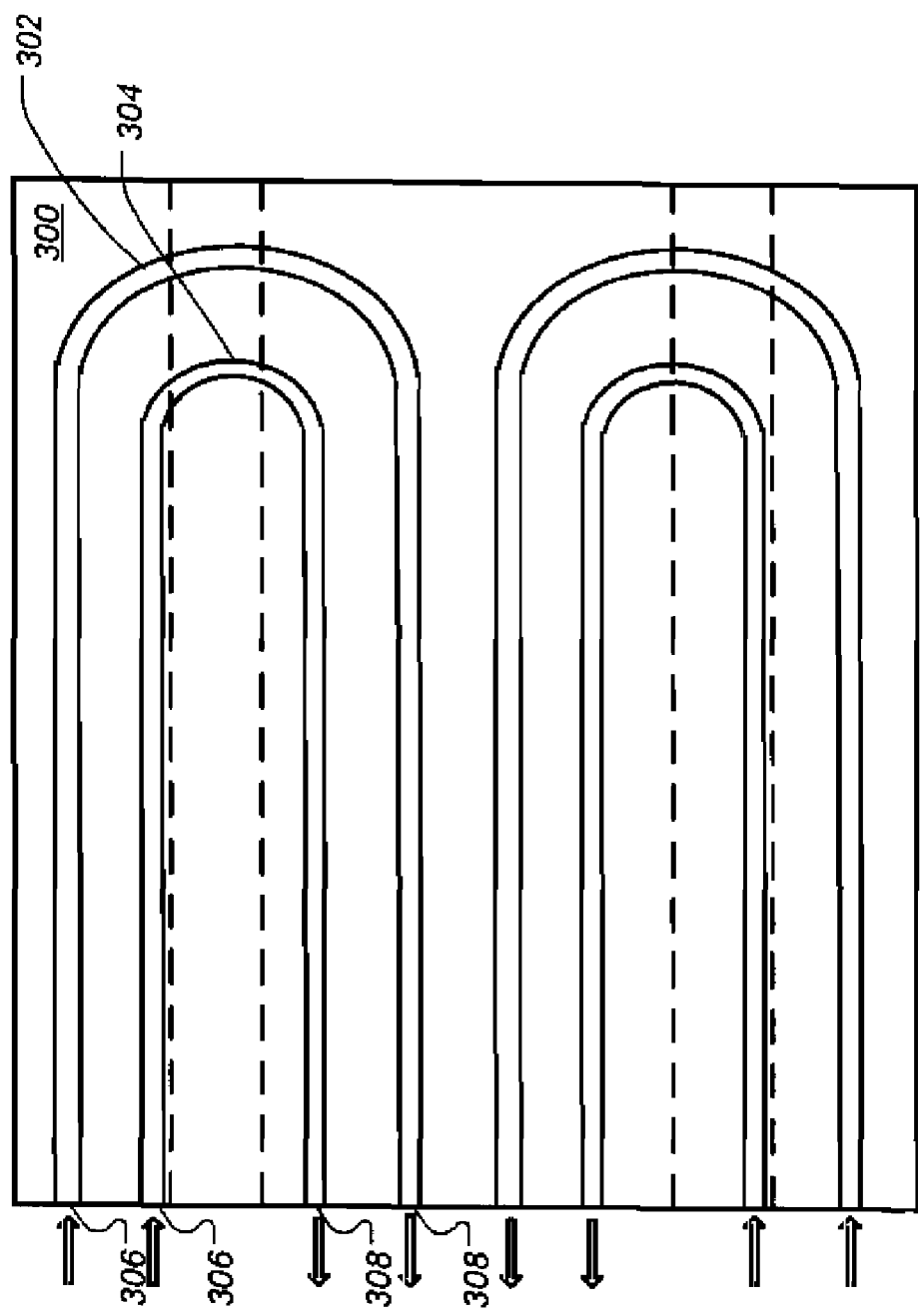
FIG. 3 shows a sectional area of a heat sink component.

FIG. 3 shows a sectional area of a heat sink component 300. In general, the figure shows the face of a layer in a heat sink, such as layer 114a from FIG. 1. As described above, the heat sink component 300 may be constructed of aluminum or other thermally conductive material, and may include portions of fluid paths 302, 304. The fluid paths 302 and 304 may be formed using standard milling or other machining techniques. For example, the fluid paths 302, 304 may be made by a milling machine working along the paths to cut semi-circular slots in the component 300. Other structures may also be machined, such as narrow grooves close to the edges of the fluid paths that can mate with projections on a mating component, and may thereby seal the paths 302, 304 from fluid leakage.

In some implementations, the fluid paths 302, 304 may be formed out of a different material than the heat sink component 300. For example, a fluid path insert may be formed out of copper and fitted into the heat sink component 300 for purposes of increasing the cooling power of a particular fluid. In general, the fluid path resembles a tube-like structure that creates a smooth surface for fluid to flow through. Other forms may be provided on the interior of fluid paths 302, 304 to increase fluid turbulence or laminar flow, and to thereby change the heat carrying capacity of the fluid in the paths 302, 304.

The heat sink component 300 may integrate cooled air or liquids, or both, to cool components. Cooling liquid may consist of fluorinert, cooking oil, motor oil, silicone oil, glycols, liquid nitrogen, brines, or other dielectric materials, to name a few examples. Liquid used in cooling the computer assemblies may be selected to have low electrical conductivity as to not interfere with normal operation of electrical components.

Component 300 may be attached to supply and return tubing so that fluid flows in a particular direction through paths 302, 304. For example, fluid paths near the edges of the heat sink 114 may be receive fluid first when it is coolest, and may be located adjacent the warmest components in a system, e.g., microprocessors, so as to draw the most heat out of those components and prevent them from overheating. Thus, for example, fluid may be supplied at port 306 near the hottest components, such as a microprocessor. The fluid may be returned around to port 308, past lower temperature components, such as a memory. In short, the heat sink structure and fluid path may be designed with a particular circuit board in mind to maximize the cooling of components. The ports 306, 308 may be provided with different fitting types to help ensure that supply lines and return lines are connected to the proper paths.

In operation, the fluid may be drawn from piping and valve mechanisms installed in computer system housing, such as server racks, as described in more detail below. For example, the piping mechanism may include fluid standpipes that are each connected by flexible connections to a rack of heat sinks. Taps off of a standpipe at each heat sink may be provided, along with shut-off and connecting mechanisms. The fluid may be received from components such as a central chiller.

Figure 4:
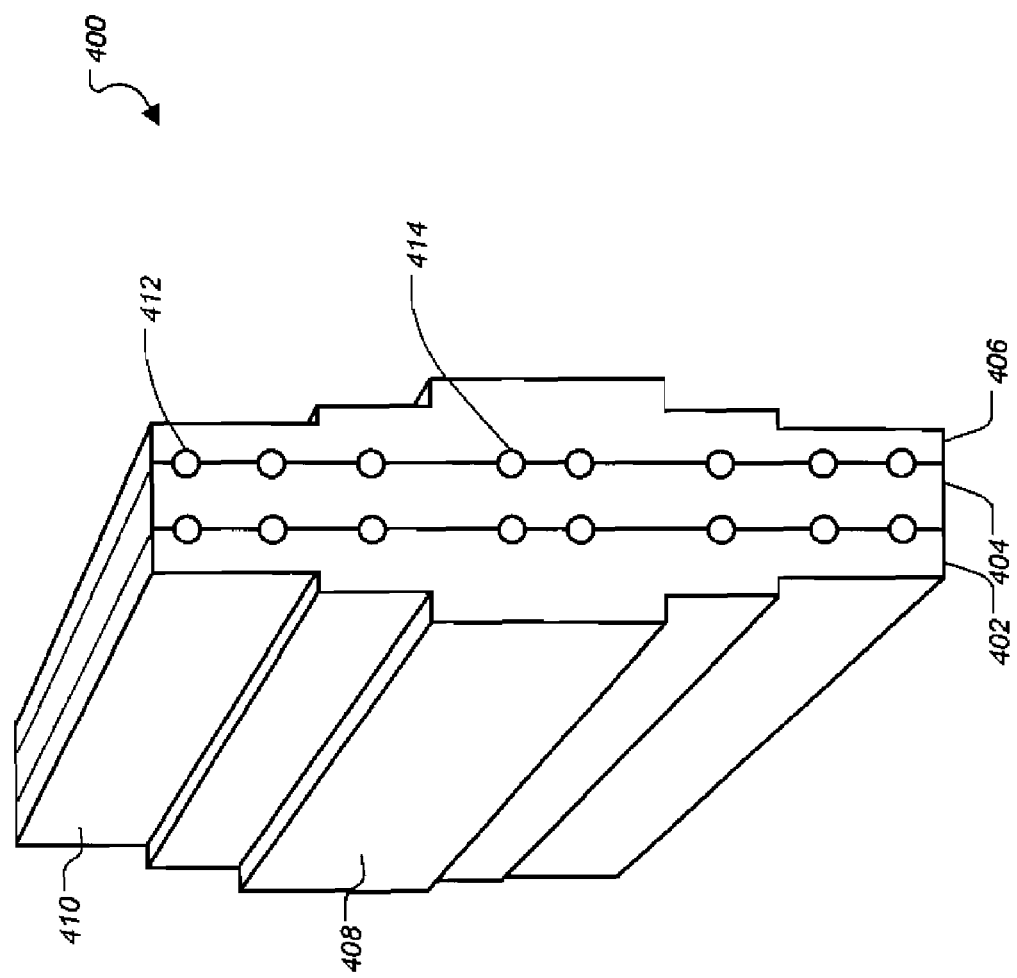
FIG. 4 is a perspective view of a heat sink.

FIG. 4 is a perspective view of a heat sink 400. This figure shows more clearly the multiple surfaces at different heights for fitting the heat sink 400 to the different heights of components on a motherboard assembly. Generally, matching a component height ensures that close physical (and thermal) contact is maintained between the heat sink 400 and the electrical component for better thermal flow. For example, low profile components (e.g., surface mount components) may be placed in the highest height 408, while high-profile components (e.g., through-hole components) may be placed in the lowest height 410. In heat sink 400, the heights are shown to vary in only one axis, under an assumption that components having equal heights will be placed in a linear arrangement; however, the heights could also vary in other directions as well, to better accommodate various layouts of components.

In this implementation, heat sink 400 is constructed of three separate sections (402, 404, and 406). Typically, each section would be welded, bonded, or otherwise held together to form one heat sink block. As shown, fluid paths may be provided between the layers. However, in some implementations, the heat sink may be a cast unit with channels being formed by cutouts or milling of the heat sink. In some implementations, mounting holes may be drilled or formed to facilitate attachment to circuit board components or server rack systems.

Fluid port 412 may be an intake port where cooling fluid flows into the heat sink 400. The intake fluid port 412 may run along components with the most thermal load, thus allowing the cooling fluid to cool these components first before circulating through the remaining paths in the heat sink 400. Similarly, fluid port 414 may be an output, or return, port for returning or discarding cooling fluid, and may therefore receive cooling fluid that has been partially warmed while traversing the heat sink 400. In some implementations, fluid path 414 may run along components emitting lower thermal loads simply because cooling ability may have diminished slightly, and these components may require less cooling.

As noted above, the heat sink 400 may be made out of any appropriate thermally conductive material or materials. Examples of such materials include aluminum, steel, and copper. Thermally conductive plastics may also be employed, such as to make formation and machining of the heat sink 400 more economical. In addition, various materials may be used. For example, layers 402, 406 may be made of a thermally conductive metal, while layer 404 may be made of a thermally conductive or nonconductive material, such as plastic, because it may be less important that heat flow through layer 404, and alternative materials may permit for less expensive fabrication. Also, layer 404 may be omitted, so that a single set of cooling channels cools both sides of heat sink 400.

Figure 5A:
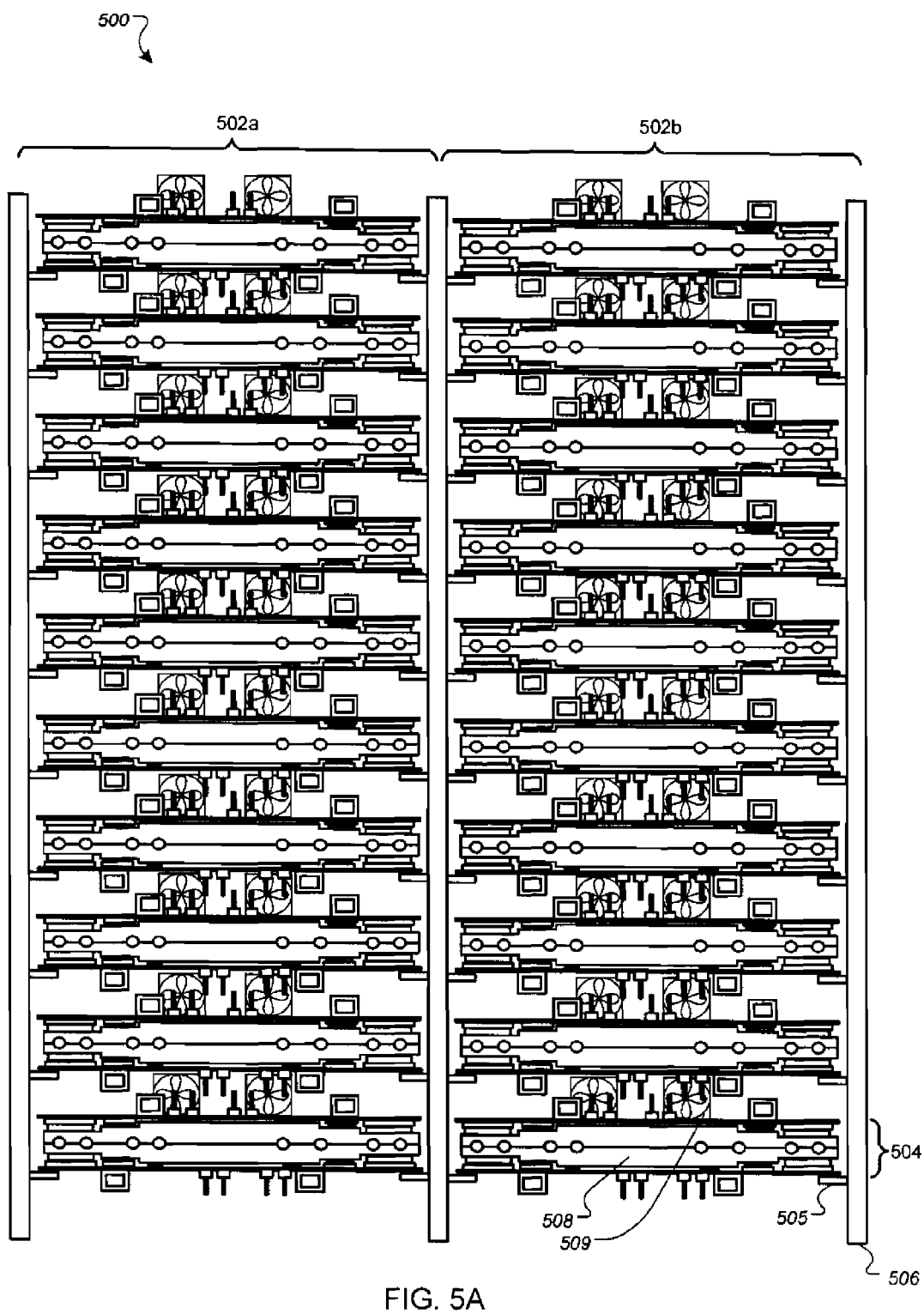
FIG. 5A is a front view of two data center racks holding a plurality of removable computer assemblies.

FIG. 5A is a front view of two data center racks 502a and 502b, holding a plurality of removable computer assemblies. This is a simplified diagram showing one particular implementation of a data center, and various other arrangements may be employed.

In general, data center 500 may be located in a fixed building, in a portable or semi-portable facility, such as a standard shipping container, or in another appropriate facility. Although the data center 500 shown includes only two racks, several racks or many racks may be arrayed in long rows, and sets of racks may be located back-to-back as shown more clearly in FIG. 5B. The rows of racks may be separated by intervening workspaces for technicians to remove and replace computing units, such as unit 504, or to make repairs. Data center 500 may contains hundreds or thousands of computer assemblies or computing units, each mounted in racks. For example, several dozen computing units may be mounted in a single rack within a space, with approximately several inches between each unit.

The large amount of heat that will inevitably be generated by such units may be removed in multiple ways. First, heat sinks such as heat sink 508 may be provided in contact with heat generating components of units like computing unit 504. The heat sinks may contain fluid paths (which would not generally be visible from the front of the racks, but are shown here for illustrative purposes) to provide cooling fluid or fluids to the heats sinks and carry away absorbed heat.

Spaces between each computing unit may permit for the circulation of air that also absorbs takes on heat from the units. As shown, a pair of small fans 509 is located at the back edge of the units—mounted to the top of each unit—to draw air through the space. The fans may be appropriately located, and walls/baffles may be provided so as to draw air efficiently through the system. The units, including unit 504, may back up to a warm air plenum that receives exhaust air from the computing units 504 and routes that air to a cooling unit that may re-circulate the air into the workspace in front of the racks.

Other components, which have been omitted from the figure for clarity, may also be provided on unit 504. For example, fixed disk drives and other forms of memory may be provided, such as on the back sides of the motherboards as explained with respect to FIG. 1. Also, baffles and other mechanical components may be provided, as may electrical components such as power supplies and components for electrical back-up, such as batteries and related control circuitry.

A pair of opposed, vertically disposed rails 506 may provide support for the units in each rack. The rails may be constructed of aluminum or other material of appropriate strength, and may be provided with a coating or left uncoated. The units may be slid into place and may rest on supports 505 provided along the height of the rails. The supports may include, for example, simple brackets such as shelving brackets that engage holes in the rails 506. The brackets may be movable in the holes so as to permit adjustment for various sizes of computing units or changes in the sizes of computing units. In addition, the brackets may be made from materials such as plastic or may be coated to reduce their electrical conductivity, and to reduce the potential for the generation of vibratory noise in the system, such as by the propagation of vibrations from the fans to the rails 506. In some implementations, the rails 506 may be used to dissipate some of the heat generated from computing units (e.g., by clamping the units to the rails and circulating cooling fluid through the rails).

In operation, each rack may hold several dozen computing units 504 that each have one or two (or more) motherboards mounted on a heat sink. The computing units 504 may simply be held in position on shelves in each rack, and may be stacked one over the other. In some implementations, horizontally aligned units may be modified to vertically aligned units. Shelving may be ESD sensitive as to not produce static when units are removed or moved. In addition, computing units 504 may be inserted into mounting hardware, such as is often associated with so-called blade servers.

As shown in the figure, the components on the motherboards may be offset from the center-line of the motherboard so that the components on the outside of the boards on the tops of the units will not align with components on the outside of the bottoms of units. Such offset allows the same design of motherboard to be used on both the top and bottom of units, and yet allows the units to be stacked more closely together because the components the extend out the farthest will not be directly above or below each other in the racks so as to interfere and prevent close-together mounting.

Computer unit 504 may be removed from a rack, or an entire rack may be moved into a workspace. As shown in the figure, two racks are positioned side-by-side. However, in some implementations, more racks may be present and each rack may have a unique arrangement with one or more of the other racks. For example, rack 502a and 502b may be tilted toward one another on the vertical to make the racks face inward. Likewise, the racks may face outward to form a circle or octagon, or may be arranged in another geometry. Various other rack arrangements may also be employed so as to fit the needs and dimensions of a particular data center implementation.

The heat from the boards, including from one or more racks that each include a plurality of boards, may be routed to a warm-air plenum, through cooling coils, and into a workspace in a data center where people monitor and attend to the various computers. The air may then be circulated back across the boards, such as through open-front cabinets that make up the racks. The air may continue to circulate over and over.

Mechanisms may be provided to control air and liquid temperature and flow in the server rack system. The rate of air flow through the fans 509 may be controlled on an individual basis for each motherboard, computer assembly, or rack, such as to maintain a set exit temperature for the air, including an exit temperature that is consistent for multiple fans across a group of rack or an entire data center. Fans may also be provided in a similar manner for a group of boards, such as a pair of adjacent boards. For example, where units are mounted in very close proximity, a single large-diameter fan may span across two units.

The particular level of temperature control may be selected as a parameter or boundary condition for the system, or may be a variable depending on other parameters of the system, such as the amount of current draw at a motherboard, unit, rack, or other unit of components. Likewise, the supply or return temperature of cooling water or air may be monitored and used as a control input for the system, or may be left to range freely as a dependent variable of other parameters in the system. For example, the flow rate of cooling air and/or the temperature of the cooling air may vary based on the amount of cooling needed to maintain specific set temperatures. In some implementations, air may freely flow to all assemblies. Liquid may likewise be controlled at various levels or allowed to flow freely.

Providing for control of the exhaust temperature of air leaving the boards, and holding the heated air in a separate space apart from the workspace, can create separate zones having high thermal mass—i.e., the warm plenum and related areas, and the cooler workspace and related areas. As a result, these masses of air may act like thermal capacitors. The warm air in the plenum area can be cooled more readily than could cooler air because the difference in temperature between the warm air and cooling water that is used to cool the air will be greater than it otherwise would be. In principle, the level of heat transfer between two zones is proportional to the difference in temperature between the zones, so that increasing the temperature difference also increases the heat transfer.

By controlling the board (e.g., server) exhaust temperatures, such as controlling exhaust fan speed to maintain a set exit temperature, the temperatures may be driven upward by slowing the circulation of air across the board, thereby improving the heat transfer between the warmed air and any cooling fluid (e.g., in a cooling coil in a warm-air plenum) even more. Although one may seek to cool electronic components by forcing as much cool air as fast as possible over the components, more efficient (and still sufficient) cooling can be achieved at the system level by going in the opposite direction by slowing the circulation.

Figure 5B:
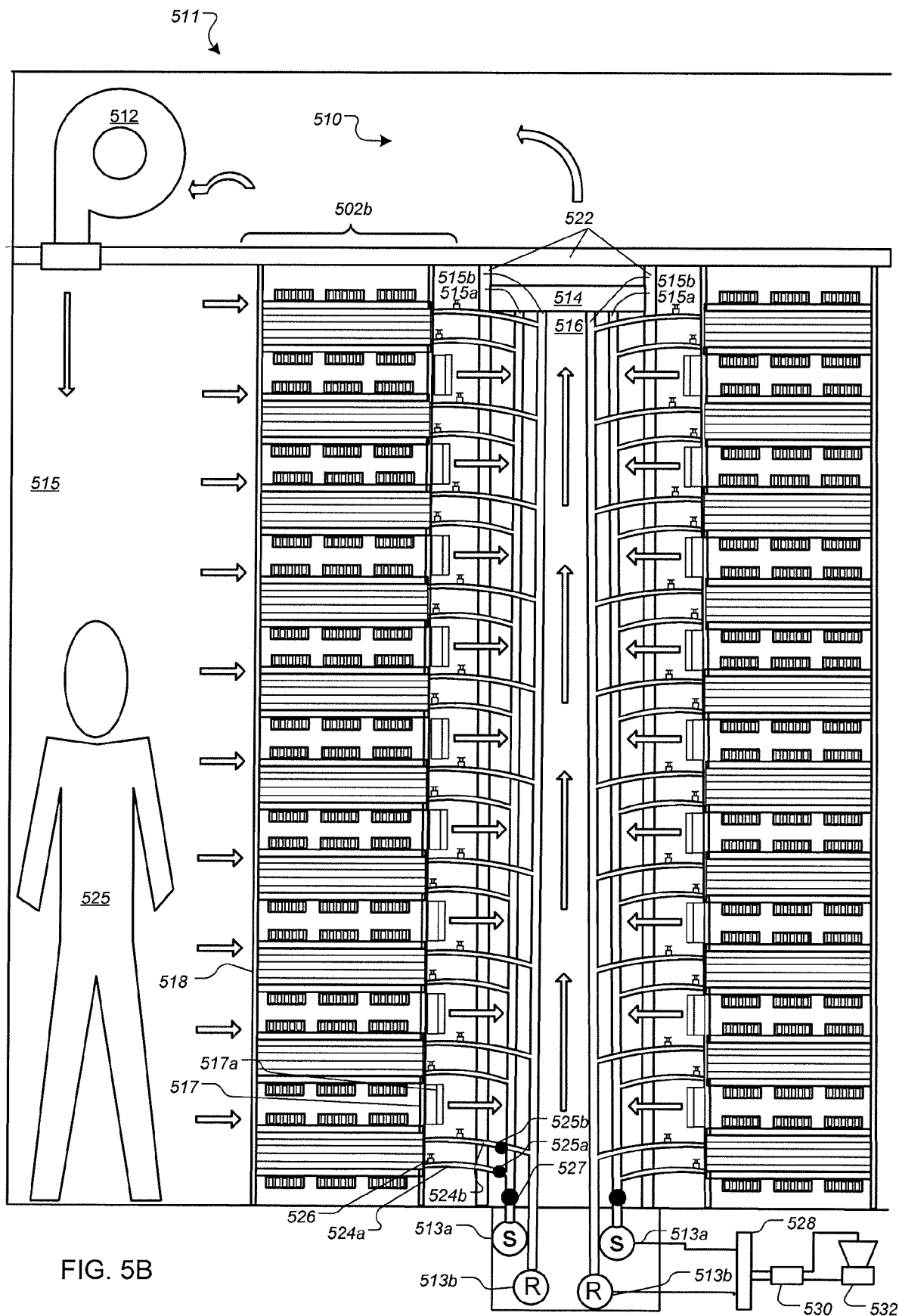
FIG. 5B is a side view of a data center ventilation system.

FIG. 5B is a side view of a data center ventilation system 500. Data center 511 is shown with racks of computing units containing motherboard assemblies mounted back-to-back below a common warm-air plenum 510. An open workspace 515 may be provided in which workers may stand when monitoring or maintaining computers in the racks. Computing units such as unit 518 may run from the floor up to or near the ceiling, which may be a drop tile ceiling, for example, at a height of approximately 8 or more feet.

In this implementation, a fan 512 is mounted inside of warm-air plenum 510, and a coil 514 is mounted at the top of a plenum 516. The fan 512 and coil 514 may also be located in other areas, for example, in the floor or space below the data center. Likewise, coil 514 may be located away from the racks so as to reduce the risk that water in the coil 512 will leak onto the racks. The plenum 516 may extract warm air from data center rack 502b using fans such as fan 517, for example. As shown, the air in plenum 516 can be forced or drawn into plenum 510 for redistribution into workspace 515 using fan 512. In some implementations, several fan coil units may be used to extract warm air from the data center racks.

In some implementations, an elevated floor may be provided at or near the bottom of the racks, on which workers in workspace 515 may stand. The elevated floor may be formed of a perforated, grid, or mesh material that permits pass-through of air; where a perforated floor is used, the area below the floor may serve as a cool (e.g., where cooling coils are mounted near the bottoms of the racks) or warm air plenum (e.g., where the under-floor plenum is open to plenum 516. Various forms of industrial flooring and platform materials may be used to produce a suitable floor that has low pressure losses for passing air.

In addition to having one or more fans located in the warm-air plenum 510, data center 500 may also include individual fans 517 near each rack. In general, fans such as fan 517 may serve more than one computing unit if sized and mounted between the units. Specifically, fan 517 may be approximately double the height and diameter of a single computing unit, and may extend from the lower computing unit in a pair up to the top of the upper computing unit in a pair. By such an arrangement, the slowest turning portions of the fan will be near the board of the top computing unit, where less airflow will normally occur because of boundary layer effects. The larger and faster moving portions of the fan 517 will be located nearer to the free areas between computing units so as to more efficiently move air over the units and through the respective power supplies. In addition, a double-height fan may be able to move more air than can a single-height fan, at lower rotation speeds. As a result, a fan in such an arrangement may produce less noise, or noise at a more tolerable frequency, than could a smaller fan. Parallel fans may also be used to increase flow, and serial fans may be used to increase pressure, where appropriate.

In some implementations, the fan 517 may be located downstream of a power supply, and the power supply located downstream of the other components of a computing unit assembly, which may maximize the heat rise across the computing unit, while still maintaining adequately low temperatures for heat-sensitive components mounted to a motherboard, such as microprocessors. Also, the power supply may be less sensitive to higher temperatures than are other components, and so may be best located at the end of the air flow, where the temperatures are highest. The speed of the fan 517 may be controlled on a timer system maintained by an automatic switch. For example, the fans may operate at high speed during peak use and operate at low speed or zero during off-peak use. In some implementations, the speed of the fans may be controlled by temperature sensors, so that the temperature of the air above each motherboard assembly stays constant. In some implementations, the rate of air flow may be controlled by each individual motherboard assembly. For example, each motherboard assembly or computing assembly may control the speed of one or more fans by way of a fan speed controller 517a.

As mentioned above, data center 511 includes piping 522 for carrying fluids, such as water, throughout system 500. The piping may define a closed-loop system having supply mains 513a and return mains 513b. Supply standpipes 515a may rise from the supply mains 513b periodically, such as at each rack in the system 500, as may return standpipes 515b. Supply taps 524a may connect along the height of supply standpipes 515a, and return taps 524b may connect along the height of return standpipes 515b. The taps may include sections of flexible tubing to permit for easier connections to computer units 518, and to permit computer units 518 to be removed partway from racks before they are disconnected by a technician or user 525. Various shut-off mechanisms may be employed to prevent leakage from disconnected taps, including twist ball-valves and automatically closing valves. Control valves 527 may also be provided in the fluid circulation system, such as at each standpipe (e.g., to control cooling for a particular rack), at each row of rack, or at each computer unit 518.

The amount of water (or other cooling fluid) supplied to each assembly 518 may be controlled by a flow sensor 525a. Alternatively, the amount of flow can be controlled by a temperature sensor 525b. For example, monitoring return water temperature may increase water flow in the system by adding more cooled water when temperatures are sensed above a particular level. In addition, the temperature of supply cooling water may be controlled. Cooling of the water may come via a refrigeration system that has liquid-to-liquid heat exchangers 528 that circulate condenser water from a chiller 530 or cooling tower 532 water through a second stage. In addition, the cooling water may be routed through a chiller 530, such as an electric chiller of gas-powered absorption chiller.

The particular positioning of components in the data center 500 may be altered to meet particular needs. For example, the location of fans 512, 517 and the coil 514 may be changed to provide for fewer changes in the direction of airflow or to grant easier access for maintenance, such as to clean or replace coils or fan motors. Appropriate techniques may also be used to lessen the noise created in workspace 515 by fans 512, 517. For example, placing coils in front of the fans 512, 517 may help to deaden noise created by the fans 512, 517. Also, selection of materials and the layout of components may be made to lessen pressure drop so as to permit for quieter operation of fans 512, 517, including by permitting lower rotational speeds of the fans 512, 517.

Although a few implementations have been described in detail above, other modifications are possible. Moreover, other mechanisms for cooling electrical components may be used. Accordingly, other implementations are within the scope of the following claims.

What is claimed is:
1. A computer apparatus, comprising:
a first motherboard having a top surface and a bottom surface;
a second motherboard having a top surface and a bottom surface;

components that generate high thermal loads mounted to the top surface of each of the first and second motherboard, and components that generate low thermal loads that are substantially less than the high thermal loads mounted to the bottom surface of one or more of the first and second motherboards; and a heat sink, located between the first motherboard and the second motherboard, in conductive thermal contact with the components that generate high thermal loads, the heat sink defining a closed fluid circulation loop inside the heat sink, that is separated from air around the apparatus, to receive a cooling fluid from a cooling system and to supply the cooling fluid to the cooling system after the cooling fluid has circulated through the heat sink.

2. The apparatus of claim 1, wherein the heat sink comprises a solid heat-conductive block housing fluid flow paths for carrying cooling fluid.

3. The apparatus of claim 1, wherein the components that generate low thermal loads mounted to the bottom surface of one or more of the first and second motherboards comprise in-line memory modules having a length that is in substantial parallel alignment with a direction of air flow across the motherboards.

4. The apparatus of claim 1, wherein each of the first and second motherboards carries a plurality of common components, and the common components are arranged linearly to align with portions of equal depth on the heat sink.

5. The apparatus of claim 1, further comprising a fan mounted adjacent to one of the first and second motherboards and arranged to circulate air across the components that generate low thermal loads.

6. The apparatus of claim 1, further comprising a fluid standpipe fluidly connected to the heat sink and arranged to provide cooling fluid to the heat sink.

7. The apparatus of claim 1, further comprising a refrigeration cycle apparatus in fluid communication with the heat sink to provide cooled fluid to the heat sink and receive warmed fluid from the heat sink wherein the refrigeration cycle apparatus is part of the cooling system.

8. The apparatus of claim 1, further comprising a plurality of computer apparatuses' mounted in data center racks'that include the heat sink.

9. The apparatus of claim 8, wherein the plurality of apparatuses include data jacks near a front edge of the apparatuses and cooling fluid connections near a rear edge of the apparatuses.

10. The apparatus of claim 1, wherein the components that generate high thermal loads include microprocessors, and the components that generate low thermal loads include memory chips and fixed storage devices.

11. The apparatus of claim 5, wherein the computer apparatus is one of a plurality of common apparatuses, and further comprising:
a computer rack holding the plurality of common apparatuses vertically relative to each other in a computer rack, and
a plurality of fans circulating air across the components that generate low thermal loads and into a closed warm air plenum.

12. The apparatus of claim 11, further comprising one or more air circulation fans positioned to circulate air from the warm air plenum through a cooling coil and into a workspace adjacent to, and open to the rack so that air from the workspace can enter the rack and cool the components that generate low thermal loads.

13. The apparatus of claim 5, what the closed fluid circulation loop comprises one or more circuits having airy ports and exit ports that are on a common side of the heat sink with the entry ports.

14. A method of organizing computer components, comprising:
providing a plurality of computer assemblies having a heat sink between a pair of motherboards, wherein high heat generating components attached to the motherboards contact the heat sink and low heat generating components that generate substantially less heat than the high heat-generating components are attached to sides of the motherboards away from the heat sink;
mounting the motherboards in a server rack; and
passing air over the low heat generating components, and passing cooling fluid from a central cooling system from the plurality of computer assemblies through an internal closed loop in the heat sink, wherein the cooling fluid is at a substantially lower temperature than the air.

15. The method of claim 14, further comprising cooling the cooling fluid as a liquid in a chiller system and circulating the liquid through a data center to the computer assemblies.

16. The method of claim 14, further comprising controlling the rate of flow of the air to maintain set operation parameters for the computer components.

17. The method of claim 16, wherein the rate of air flow is controlled individually for each of the plurality of computer assemblies.

18. A computer cooling system, comprising:
a heat sink mounted between a pair of motherboards in thermal contact with high heat-generating components on a first side of each motherboard, the heat sink defining a closed fluid circulation path with a first port for receiving cooling fluid from a cooling system and a second port for supplying the cooling fluid back to the cooling system;
low heat generating components on a second side of each motherboard, wherein the low heat generating components and the high heat generating components are substantially segregated on opposed sides of the motherboard; and
one or more fans arranged to move air across the second side of each of the motherboards.

19. The system of claim 18, further comprising a liquid cooling system fluidically connected to the heat sink, and wherein the liquid cooling system is set to deliver liquid to the heat sink at a temperature that is substantially lower than a temperature of air circulated by the one of the fans.

20. The system of claim 18, wherein the low heat generating components are mounted to circuit boards that extend laterally away from each motherboard, and wherein the circuit boards are mounted in substantially parallel alignment to a direction of airflow from the one or more fans.

* * * * *

UNITED STATES PATENT AND TRADEMARK OFFICE
CERTIFICATE OF CORRECTION

PATENT NO.          : 7,564,685 B2                                          Page 1 of 1
APPLICATION NO.     : 11/618611
DATED               : July 21, 2009
INVENTOR(S)         : Jimmy Clidaras and Winnie Leung It is certified that error appears in the above-identified patent and that said Letters Patent is hereby corrected as shown below:

Column 15, line 39, Claim 7, after "sink" insert -- , --.

Column 15, line 42, Claim 8, delete "apparatuses'" and insert -- apparatuses, --, therefor.

Column 15, line 42, Claim 8, delete "racks'" and insert -- racks, --, therefor.

Column 16, line 7, Claim 13, delete "what" and insert -- wherein --, therefor.

Column 16, line 8, Claim 13, delete "airy" and insert -- entry --, therefor.

Column 16, line 54, Claim 19, delete "of the" and insert -- or more --, therefor.

Signed and Sealed this

Eighth Day of September, 2009

David J. Kappos
*Director of the United States Patent and Trademark Office*